(12) United States Patent
Kojima et al.

(10) Patent No.: US 11,791,448 B2
(45) Date of Patent: Oct. 17, 2023

(54) LIGHT-EMITTING DEVICE AND ELEMENT MOUNTING WIRING BOARD

(71) Applicant: NICHIA CORPORATION, Anan (JP)

(72) Inventors: Atsushi Kojima, Tokushima (JP); Kenji Ozeki, Tokushima (JP); Chinami Nakai, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/736,764

(22) Filed: May 4, 2022

(65) Prior Publication Data

US 2022/0263003 A1    Aug. 18, 2022

Related U.S. Application Data

(62) Division of application No. 16/928,233, filed on Jul. 14, 2020, now Pat. No. 11,362,248.

(30) Foreign Application Priority Data

Jul. 25, 2019   (JP) .................................. 2019-136676

(51) Int. Cl.
*H01L 33/62* (2010.01)
*H01L 33/00* (2010.01)
*H01L 33/56* (2010.01)
*H01L 33/48* (2010.01)
*H01L 33/60* (2010.01)

(52) U.S. Cl.
CPC .......... *H01L 33/62* (2013.01); *H01L 33/0093* (2020.05); *H01L 33/486* (2013.01); *H01L 33/56* (2013.01); *H01L 33/60* (2013.01); *H01L 2933/005* (2013.01); *H01L 2933/0058* (2013.01); *H01L 2933/0066* (2013.01)

(58) Field of Classification Search
None
See application file for complete search history.

(56) References Cited

U.S. PATENT DOCUMENTS 11,362,248 B2 * 6/2022 Kojima ............... H01L 33/0093
2021/0013376 A1   1/2021 Kim et al.

FOREIGN PATENT DOCUMENTS

| JP | H07-115257 A | 5/1995 |
|---|---|---|
| JP | H08-181414 A | 7/1996 |
| JP | 2005-183631 A | 7/2005 |

(Continued)

OTHER PUBLICATIONS

Notice of Allowance in U.S. Appl. No. 16/928,233, dated Feb. 28, 2022.

*Primary Examiner* — Robert K Carpenter
(74) *Attorney, Agent, or Firm* — Foley & Lardner LLP

(57) ABSTRACT

A light-emitting device includes: a light-emitting element; a wiring board that includes: a substrate, and a wiring pattern including: a plating base layer disposed on the substrate so as to have a gap portion that surrounds a first region in which the light-emitting element is mounted, and a plating layer having a groove that surrounds the first region; a first covering member, at least a portion of which is located in the groove and includes: a reflective material containing layer that contains a first reflective material, and a light-transmissive layer formed above the reflective material containing layer; and a light-transmissive member disposed on the first covering member and the light-emitting element.

9 Claims, 12 Drawing Sheets

(56) References Cited

FOREIGN PATENT DOCUMENTS

| | | | |
|---|---|---|---|
| JP | 2009-117637 | A | 5/2009 |
| JP | 2010-153744 | A | 7/2010 |
| JP | 2012-109352 | A | 6/2012 |
| JP | 2013-070043 | A | 4/2013 |
| JP | 2014-072415 | A | 4/2014 |
| JP | 2016-072412 | A | 5/2016 |
| JP | 2017-204623 | A | 11/2017 |
| JP | 2019-021919 | A | 2/2019 |

* cited by examiner

LIGHT-EMITTING DEVICE AND ELEMENT MOUNTING WIRING BOARD

CROSS-REFERENCE TO RELATED APPLICATION

This application is a divisional of U.S. patent application Ser. No. 16/928,233, filed Jul. 14, 2020, which claims priority to Japanese Patent Application No. 2019-136676, filed on Jul. 25, 2019, the disclosures of which are hereby incorporated by reference in their entireties.

BACKGROUND

The present disclosure relates to a method of manufacturing a light-emitting device, a light-emitting device, an element mounting wiring board, and a method of manufacturing an element mounting wiring board.

A light-emitting device with a substrate on which a light-emitting element is mounted is conventionally known. For example, Japanese Patent Publication No. 2017-204623 discloses a light-emitting device including: a package in which a recess with a lateral surface and a bottom surface is formed and in which a groove is formed on the bottom surface of the recess and surrounds an element-mounting region; and a light-reflective resin that is formed continuously from the lateral surface of the recess to an outer upper edge of the groove. Also, for example, Japanese Patent Publication No. 2014-72415 discloses a light-emitting device including: a layered substrate that has a recess defined by a lateral surface and a bottom surface and has grooves intermittently formed around a light-emitting element disposed on the bottom surface of the recess; and a light-reflective resin blocked by the grooves, formed at an outer side of the grooves of the layered substrate.

SUMMARY

In the technology disclosed in the above patent literature, light-emission efficiency has room for further improvement.

An object of certain embodiments according to the present disclosure is to provide a method of manufacturing a light-emitting device with high light-emission efficiency, the light-emitting device with high light-emission efficiency, an element mounting wiring board for such a light-emitting device, and a method of manufacturing the element mounting wiring board.

According to one embodiment of the disclosure, a method of manufacturing a light-emitting device includes: providing a wiring board including a substrate and a wiring pattern, the wiring pattern including a plating base layer disposed on the substrate so as to have a gap portion that surrounds a first region in which a light-emitting element is mounted, and a plating layer having a groove that surrounds the first region; mounting the light-emitting element in the first region; supplying a first resin that contains a first reflective material into the groove; forming a first covering member, which comprises sedimenting the first reflective material contained in the first resin by applying a centrifugal force to the first resin, so that the first covering member includes a reflective material containing layer containing the first reflective material and a light-transmissive layer formed above the reflective material containing layer, in the groove; and forming a light-transmissive member on the first covering member and the light-emitting element.

According to another embodiment of the disclosure, a light-emitting device includes: a wiring board that includes a substrate, a plating base layer disposed on the substrate so as to have a gap portion that surrounds a first region in which a light-emitting element is mounted, and a plating layer having a groove that surrounds the first region; a first covering member disposed at least in the groove; and a light-transmissive member disposed on the first covering member and the light-emitting element. The first covering member includes a reflective material containing layer that contains a first reflective material, and a light-transmissive layer formed above the reflective material containing layer, in the groove.

According to another embodiment of the disclosure, an element mounting wiring board includes: a substrate; and a wiring pattern. The wiring pattern includes a plating base layer disposed on the substrate so as to have a gap portion that surrounds a first region in which a light-emitting element is mounted, and a plating layer that has a groove surrounding the first region.

Certain embodiments of the present disclosure provide a method of manufacturing a light-emitting device with high light-emission efficiency, the light-emitting device with high light-emission efficiency, an element mounting wiring board for such a light-emitting device, and a method of manufacturing the element mounting wiring board.

DETAILED DESCRIPTION

Figure 1A:
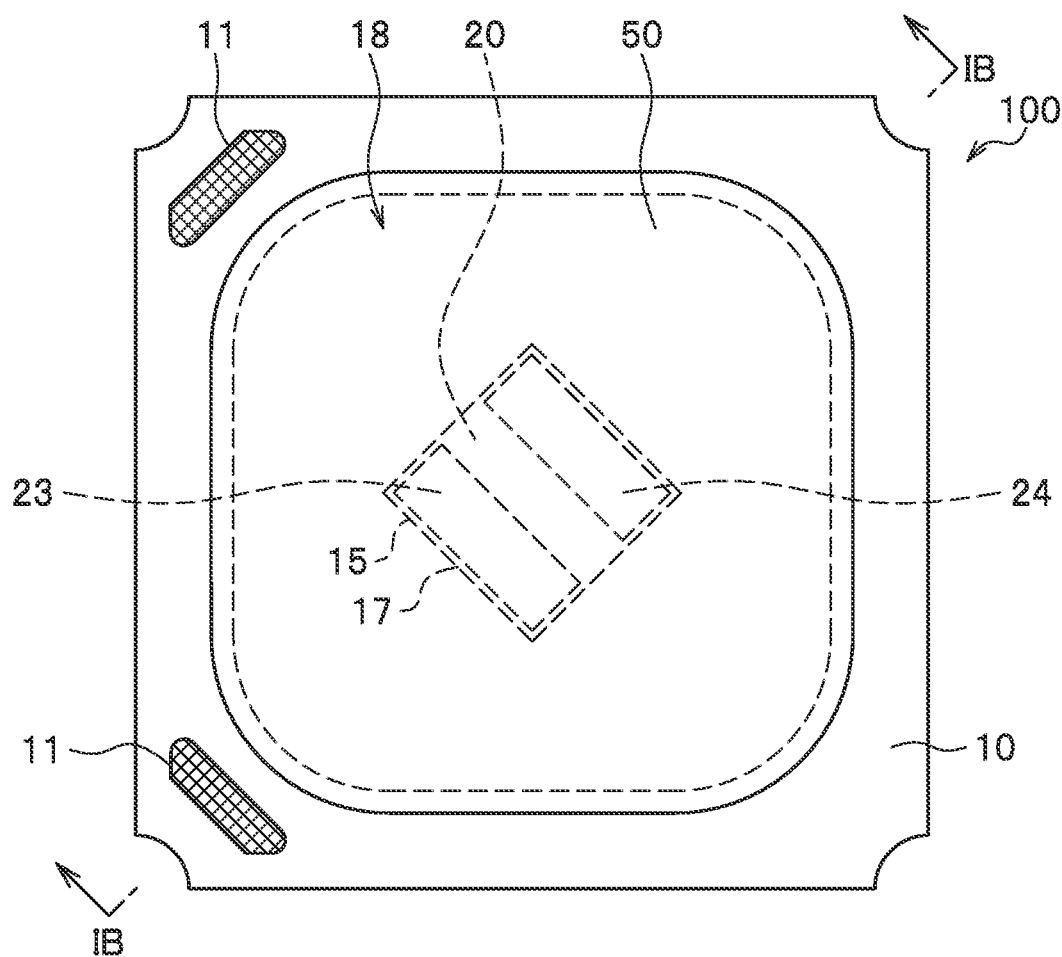
FIG. 1A is a schematic top view illustrating the structure of a light-emitting device according to certain embodiment.

Certain embodiments of the present disclosure will be described below with reference to the drawings. The embodiments described below are examples of a method of manufacturing a light-emitting device, a light-emitting device, an element mounting wiring board, and a method of manufacturing an element mounting wiring board, embodying the technical ideas of the present disclosure. However, the present disclosure is not limited to the embodiments described below. Unless specifically stated otherwise, the sizes, materials, shapes, and relative positions of constituent components described with reference to the embodiments are not intended to limit the scope of the present invention, but are rather merely examples. Magnitudes or positional relationships of members illustrated in the drawings may be exaggerated in order to clarify the descriptions.

Light-Emitting Device

Figure 1B:
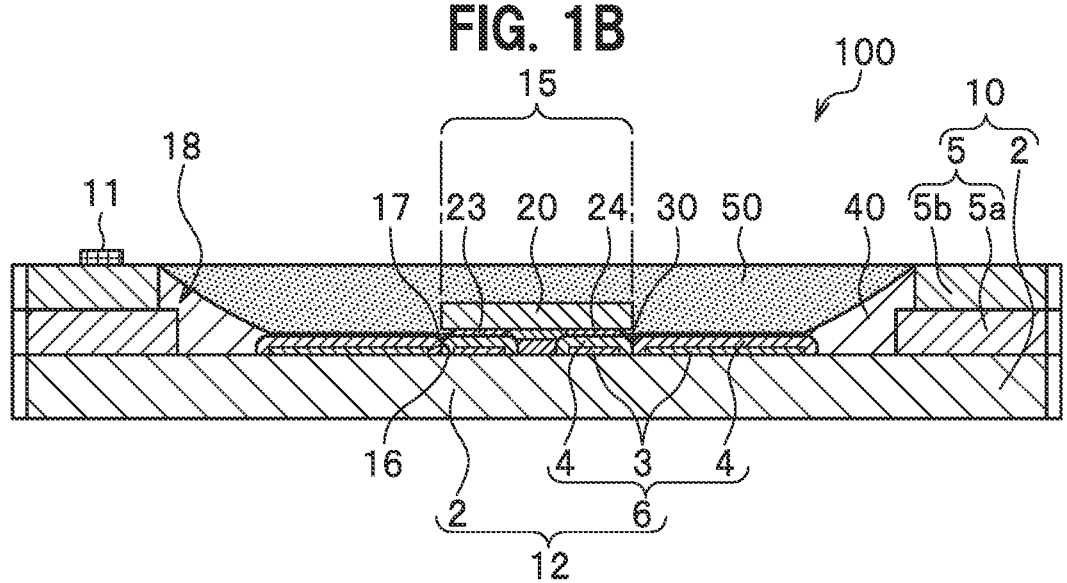
FIG. 1B is a schematic cross-sectional view taken along the line IB-IB of FIG. 1A.
Figure 1C:
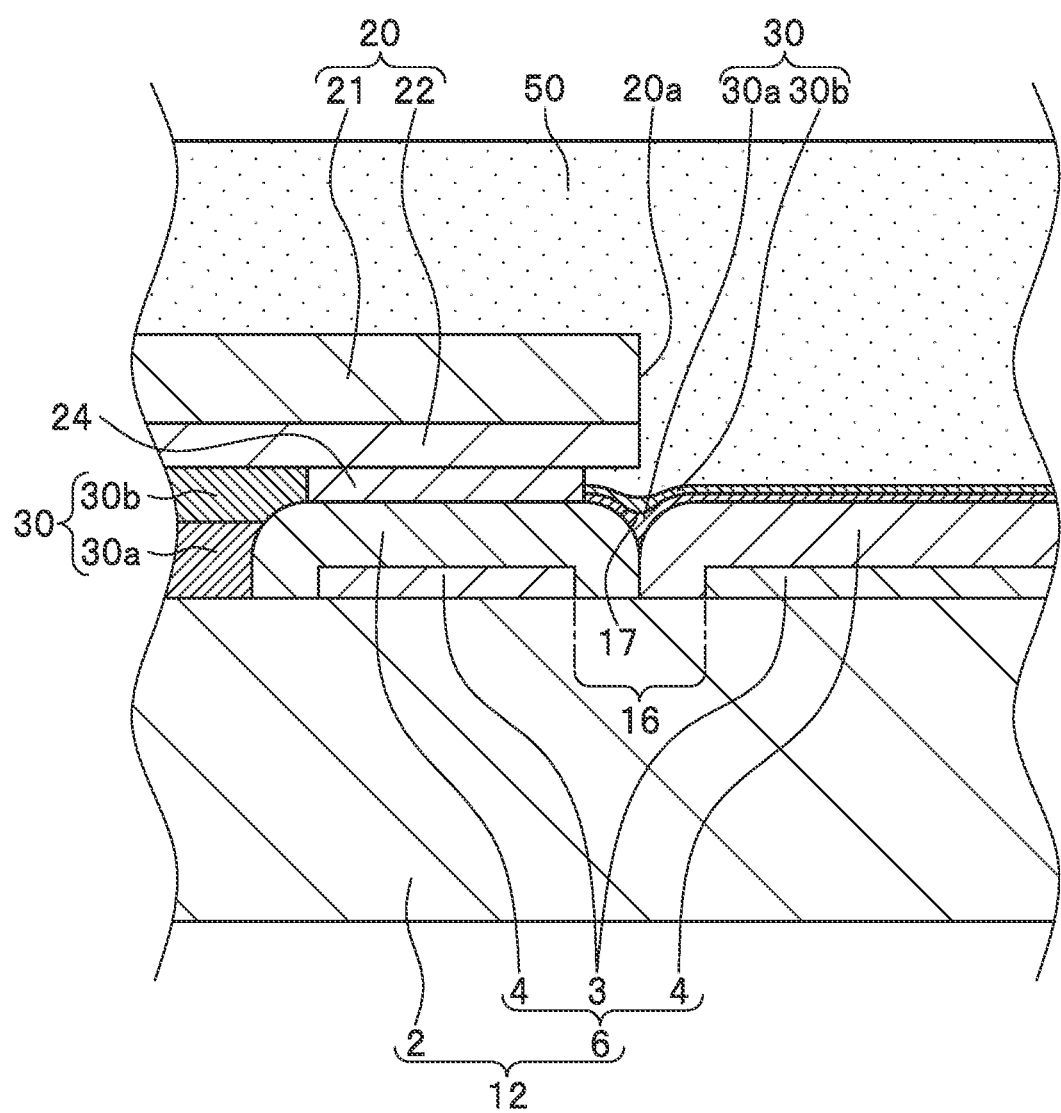
FIG. 1C is a schematic enlarged cross-sectional view illustrating a portion of the structure of the light-emitting device according to the embodiment.
Figure 1D:
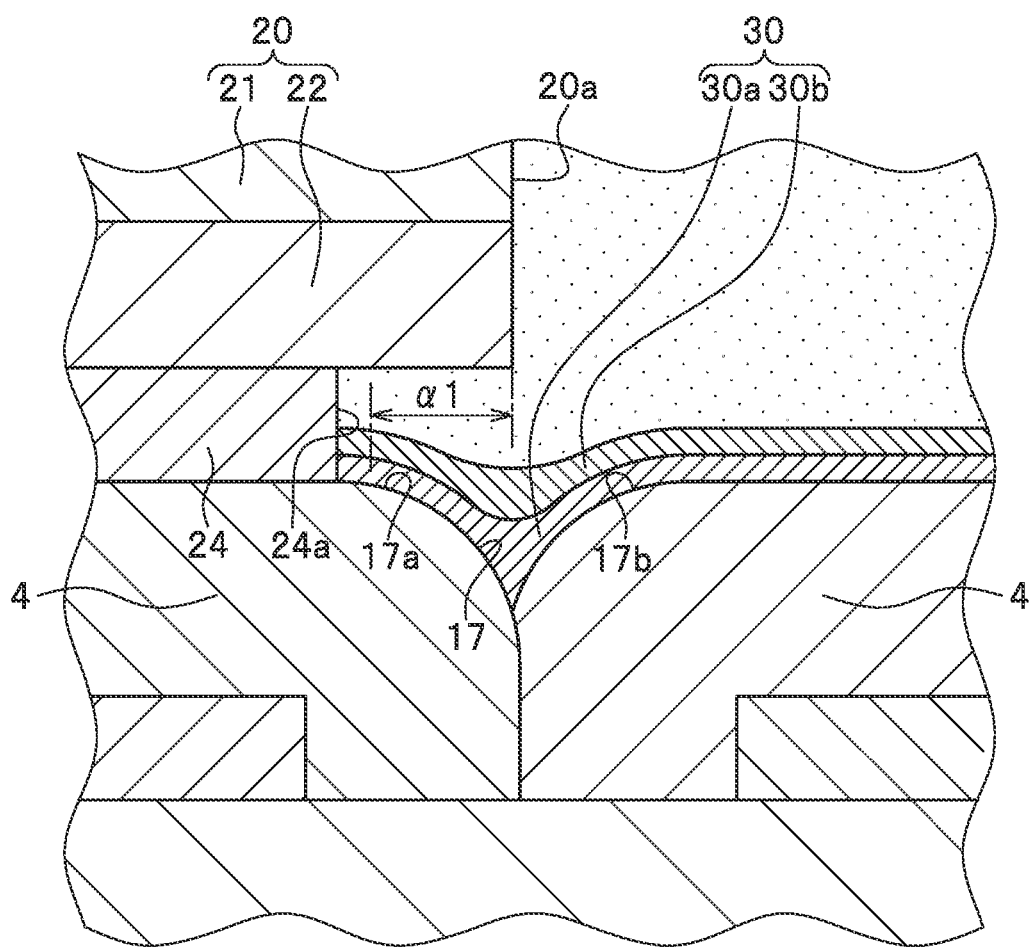
FIG. 1D is a schematic enlarged cross-sectional view illustrating a portion of the structure of the light-emitting device according to the embodiment to show a positional relationship between a groove and a light-emitting element.

FIG. 1A is a schematic top view illustrating the structure of a light-emitting device according to an embodiment. FIG. 1B is a schematic cross-sectional view taken along the line IB-IB of FIG. 1A. FIG. 1C is a schematic enlarged cross-sectional view illustrating a portion of the structure of the light-emitting device according to the embodiment. FIG. 1D is a schematic enlarged cross-sectional view illustrating, in a portion of the structure of the light-emitting device according to the embodiment, a positional relationship between a groove and a light-emitting element. In FIG. 1A, the deepest portion of a groove is indicated by a reference numeral 17.

A light-emitting device 100 includes: a wiring board 12 that includes a substrate 2, the light-emitting element 20, a first covering member 30, and a light-transmissive member 50. The wiring board 12 includes a plating base layer 3 and a plating layer 4. The plating base layer 3 is disposed on the substrate 20 while having a gap portion 16 surrounding a first region 15 in which a light-emitting element 20 is mounted. The plating layer 4 has a groove 17 that surrounds the first region 15. The light-emitting element 20 is mounted in the first region 15. The first covering member 30 is disposed at least in the groove 17. The light-transmissive member 50 is formed on the first covering member 30 and the light-emitting element 20. Further, in the light-emitting device 100, the first covering member 30 includes, in the groove 17: a reflective material containing layer 30a containing a first reflective material; and a light-transmissive layer 30b formed above the reflective material containing layer 30a.

In the present disclosure, the first region 15 refers to a region on the upper surface of the wiring board 12, in which the light-emitting element 20 is mounted, and which is defined by the gap portion 16 and the groove 17 of the plating layer 4 located above the gap portion 16. Such a structure of the groove 17 allows the light-emitting element 20 can be disposed precisely in the first region 15 by a self-alignment effect in the case of being disposed via a bonding member such as solder. The first region 15 can be any region surrounded by the outer edge of the gap portion 16 and the outer edge of the groove 17 (that is, an outer upper edge 17b of the groove 17). The outer edge of the first region 15 overlaps the deepest portion of the groove 17 in a top view.

The light-emitting device 100 includes the wiring board 12, the light-emitting element 20, the first covering member 30, a second covering member 40, and the light-transmissive member 50.

Further, the wiring board 12 includes the substrate 2, and a wiring pattern 6 formed by the plating base layer 3 and the plating layer 4.

Configurations of the light-emitting device 100 will be described below.

The light-emitting device 100 includes a package 10 that has a recess 18. The recess 18 is defined by a bottom surface, which is an upward-facing surface of the substrate 2, and a lateral surface of a lateral wall 5 that surrounds the bottom surface. The opening of the recess 18 has, for example, a substantially rectangular shape having curved corners in a top view. The substrate 2 has, for example, a substantially rectangular shape with four corners of each having a rectangular shape being cut in an arc shape in a top view.

The lateral wall 5 is formed at a periphery of an upper surface of the substrate 2. The lateral wall 5 includes a first lateral wall portion 5a and a second lateral wall portion 5b continuous with the first lateral wall portion 5a in this order from the substrate 2.

Each of the substrate 2, the first lateral wall portion 5a, and the second lateral wall portion 5b are disposed so as to have an inner lateral surface with steps. The outer lateral surface of the first lateral wall portion 5a and the outer lateral surface of the second lateral wall portion 5b are flush with each other, and the inner lateral surface of the first lateral wall portion 5a is inward of the inner lateral surface of the second lateral wall portion 5b. Positioning a portion of the first lateral wall portion 5a inward than the second wall portion 5b can increase adhesion of the second covering member 40 to the first lateral wall portion 5a. Alternatively, the lateral surfaces of the recess 18 can have inclined surfaces that broaden from the bottom surface towards the opening, instead of the steps. The second lateral wall portion 5b has two corner portions each indicating a polarity mark 11 of the light-emitting device.

Examples of the substrate 2 and the lateral wall 5 to be used include a glass epoxy resin, a ceramic, and glass. In the case in which a ceramic is used for the substrate 2 and the lateral wall 5, alumina, aluminum nitride, mullite, silicon carbide, silicon nitride, or the like is particularly preferably used. Using a ceramic package for the package 10 may improve the durability of the package 10. Examples of the substrate 2 and the lateral wall 5 to be used also include a thermoplastic resin such as polyamides (PA), polyphthalamides (PPA), polyphenylene sulfides (PPS), or liquid crystal polymers, or a thermosetting resin such as epoxy resins, silicone resins, modified epoxy resins, urethane resins, or phenolic resins.

Figure 3A:
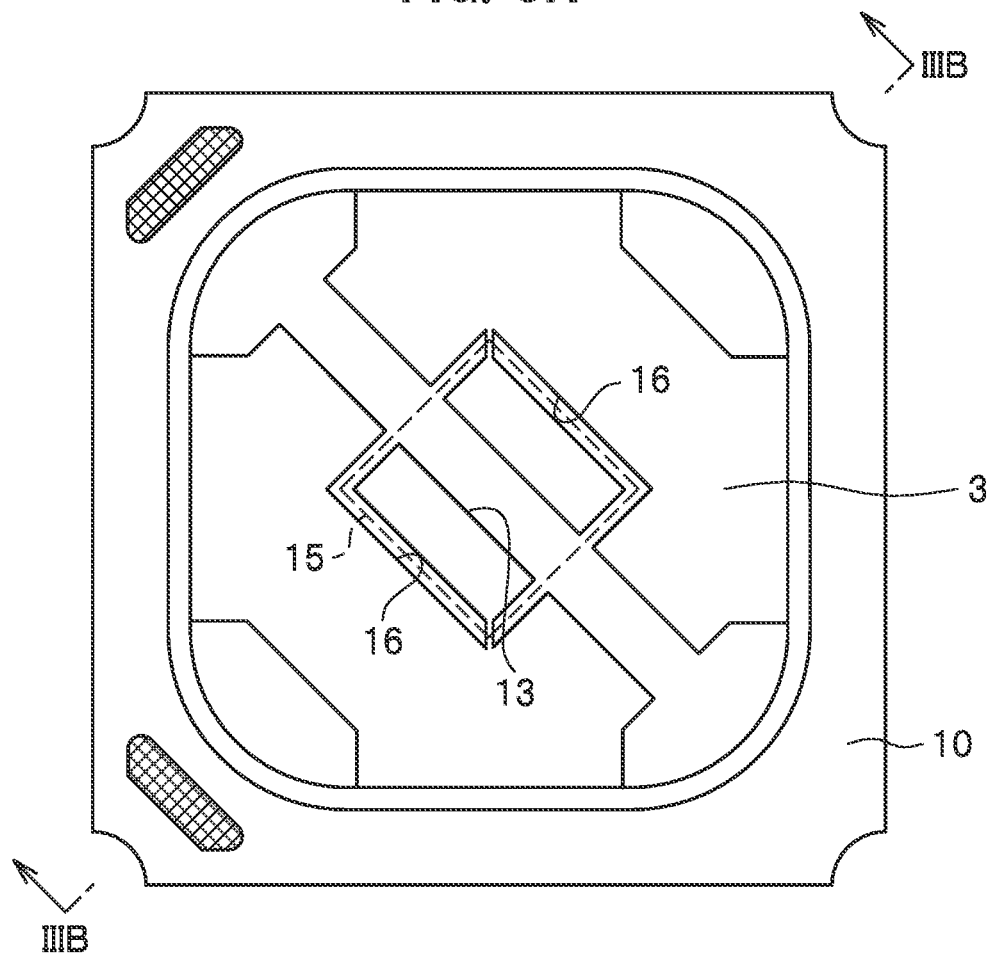
FIG. 3A is a schematic top view illustrating a step of forming a plating base layer in the method of manufacturing the light-emitting device according to the embodiment.
Figure 3B:
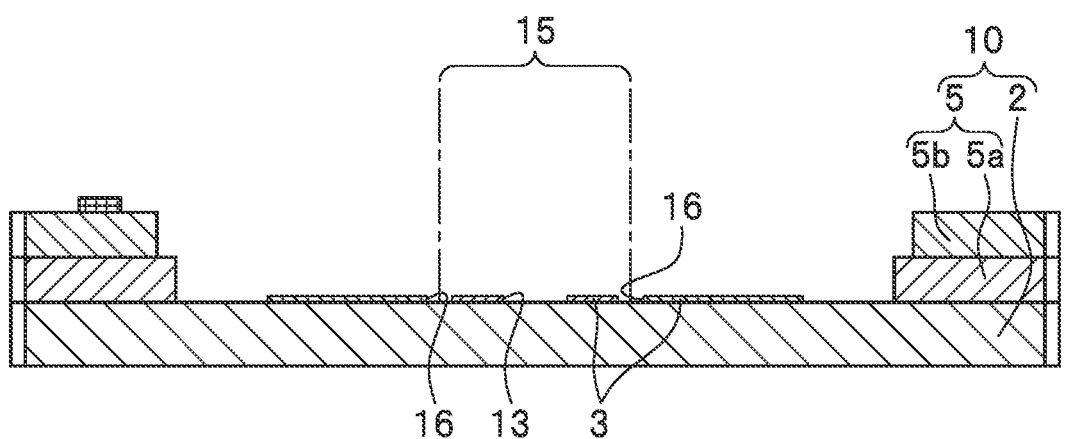
FIG. 3B is a schematic cross-sectional view taken along the line IIIB-IIIB of FIG. 3A illustrating the step of forming the plating base layer in the method of manufacturing the light-emitting device according to the embodiment.

The plating base layer 3 is disposed on the substrate 2. As shown in FIGS. 3A and 3B, the plating base layer 3 has the gap portion 16 that surrounds the first region 15. In the present disclosure, the outer edge of the first region 15 overlaps with the gap portion 16 in a top view. That is, the statement "the gap portion 16 surround the first region 15" encompasses a configuration in which that the outer edge of the first region 15 overlaps with the gap portion 16 in a top view. The gap portion 16 of the plating base layer 3 can facilitate the plating layer 4 covering the lateral surfaces of the plating base layer 3 to enter the gap portion 16 when the plating layer 4 is formed on the surface of the plating base layer 3, whereby the groove 17 is formed. The plating base layer 3 in the first region 15 has a separate portion 13 that separates a pair of positive and negative electrodes. In this case, the gap portion 16 surrounds the first region 15 via the separate portion 13. The lateral surfaces of the plating base layer 3 face each other across the separate portion 13, and are covered with the plating layer 4. Thus, in the first region 15, the plating base layers 3 are formed across the separate portion 13 with a greater width than the width of the gap portion 16, that is, a width which does not cause the plating layers 4 to be in contact with each other.

In the gap portion 16 and the separate portion 13, the substrate 2 is exposed from the plating base layer.

The gap portion 16 surrounding the first region 15 can be a continuous gap portion or a plurality of gap portions 16 that are formed intermittently as shown in FIG. 3A in a top view. That is, part of the plating base layer 3 disposed in the first region 15 and part of the plating base layer 3 disposed in a region other than the first region 15 can be completely separated by the gap portion 16, or partly connected to each other.

The gap portion 16 preferably has a width of one time or more and less than twice the thickness of the plating layer 4. If the width of the gap portion is one time or more the thickness of the plating layer 4, the depth of the groove 17 can be readily made deeper. On the other hand, if the width is less than twice the thickness of the plating layer 4, the width of the groove 17 can be readily made greater.

The plating base layer 3 preferably has a thickness of 5 μm or more and 20 μm or less. If the thickness of the plating base layer 3 is 5 μm or more, the depth of the groove 17 can be readily deeper. On the other hand, if the thickness is 20 μm or less, forming of the plating layer 4 is readily performed.

For example, W, Cu, Ni, Ag, Au, Pd, Pt, or an alloy containing one of these metals can be used for the plating base layer 3.

Figure 4A:
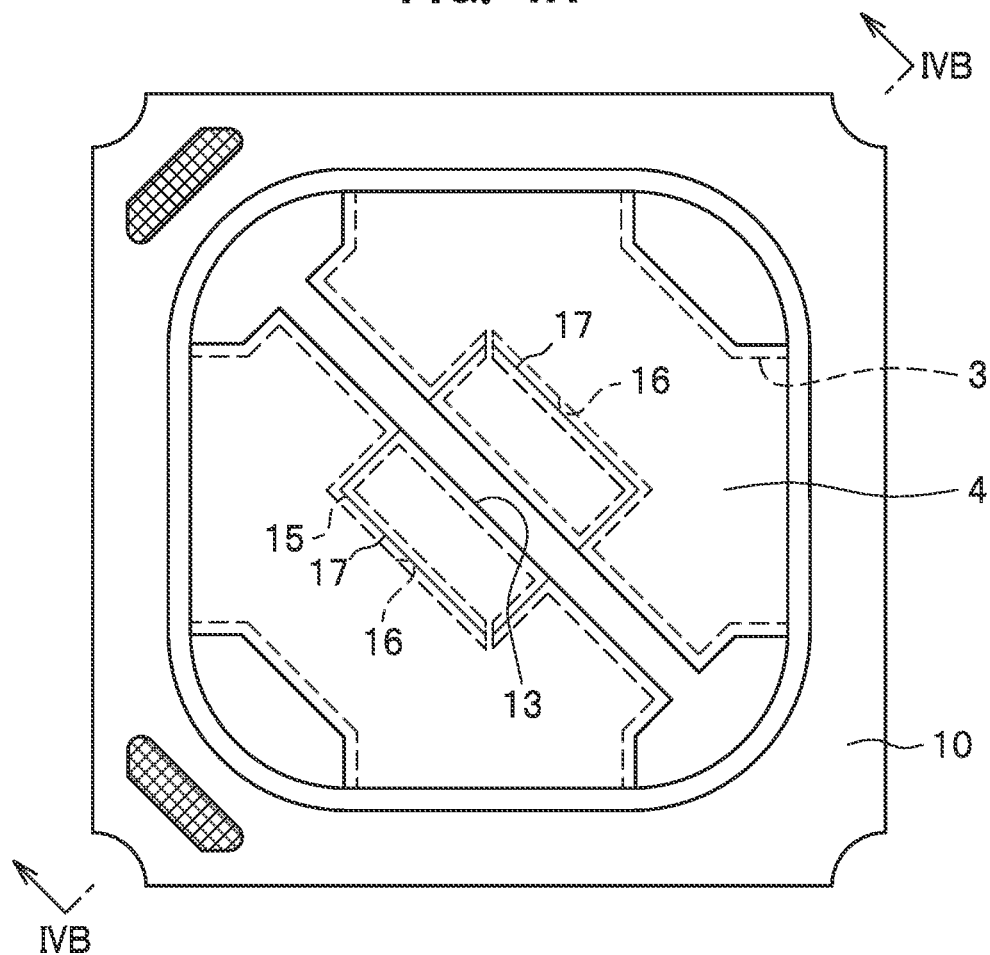
FIG. 4A is a schematic top view illustrating a step of forming a groove in the method of manufacturing the light-emitting device according to the embodiment.

The plating layer 4 is formed to cover the plating base layer 3. The plating layer 4 includes the groove 17 that surrounds the first region 15 on the surface of the plating layer 4. In the present disclosure, the outer edge of the first region 15 is located above the groove 17 in a top view. That is, the statement "the groove 17 surrounds the first region 15" encompasses a configuration in which the outer edge of the first region 15 overlaps the groove 17 in a top view. The groove 17 of the plating layer 4 may improve a self-alignment effect when the light-emitting element 20 is disposed in the first region 15 in manufacturing the light-emitting device 100. The groove 17 in the present embodiment surrounds the first region 15 in a rectangular annular shape via the separate portion 13 in a top view as shown in FIG. 4A. The groove 17 can surround the first region 15 with a different shape such as a circular annular shape or a rhombus annular shape.

The groove 17 is a depression generated at a portion in which the plating layers 4 formed on the plating base layers 3 are in contact with each other. In the light-emitting device 100, the plating layers 4 are in contact with each other in a portion at which the groove 17 is formed. The plating layers 4 in contact with each other allow the adjacent plating base layers 3 to be electrically connected to each other, even if the plating base layers 3 are completely separated by the gap portion 16. Also, in the light-emitting device 100 shown in FIG. 4A, the plating layers 4 are in contact with each other. This can increase the whole area of the wiring pattern 6, so that good heat dissipation can be secured.

The groove 17 is formed by bringing into contact the plating layers 4 that cover the lateral surfaces of the plating base layers 3 opposite each other. Thus, the lateral surfaces of the groove 17 can be readily formed in a convex curved surface toward inside the groove 17.

In the case in which the light-emitting element 20 is flip-chip mounted on the wiring pattern 6, the groove 17 is preferably formed such that the inner upper edge 17a, which is an edge of the groove 17 and is close to the first region 15, is located at a portion directly below lateral surfaces (for example, the lateral surface 24a of the element electrode 24 shown in FIG. 1D) of the pair of the element electrodes 23 and 24 that are formed on the lower surface of the light-emitting element 20, or such that the inner upper edge 17a of the groove 17 is located slightly outside a portion directly below the lateral surfaces of the pair of the element electrodes 23 and 24. The closer the inner upper edge 17a of the groove 17 is to the portion directly below the lateral surface of the pair of the element electrodes 23 and 24, the more the self-alignment effect is improved. In the case in which the inner upper edge 17a of the groove 17 is formed to be located outside the portion directly below the lateral surface of the pair of the element electrodes 23 and 24, the light-emitting element 20 is stably mounted in the first region 15 with ease.

The groove 17 is preferably formed closer to the light-emitting element 20. Specifically, the groove 17 is preferably formed at a distance of 10 μm or less from the light-emitting element 20. That is, the distance between the lateral surface 20a of the light-emitting element 20 and the inner upper edge 17a of the groove 17 is preferably 10 μm or less. In the case in which the distance from the light-emitting element 20 is 10 μm or less, light from the light-emitting element 20 is readily reflected by the reflective material containing layer 30a, so that the light-emission efficiency is increased. In order to obtain more improved light-emission efficiency, it is preferable that the groove 17 be closer to the light-emitting element 20 in a top view, and it is more preferable that the lateral surface 20a of the light-emitting element 20 be formed to be located between the inner upper edge 17a and the outer upper edge 17b of the groove 17 in a top view.

In short, in the case in which the outer upper edge 17b of the groove 17 is located outside the lateral surface 20a of the light-emitting element 20 in a top view, the portion directly below the lateral surface 20a of the light-emitting element 20 can be located above the groove 17 in a top view. In this case, in consideration of the mountability and heat dissipation of the light-emitting element 20, a distance al between the lateral surface 20a of the light-emitting element 20 and the inner upper edge 17a of the groove 17 is preferably 50 μm or less. In consideration of the light emitted from the light-emitting element 20 and reflected by the reflective material containing layer 30a, the deepest portion of the groove 17 is preferably located at the portion directly below the lateral surface 20a of the light-emitting element 20 in a top view, or approximately 10 μm outside from the portion directly below the lateral surface 20a of the light-emitting element 20. The groove 17 is formed such that the portion directly below the lateral surface 20a of the light-emitting element 20 is located at the center of the groove 17 in the width direction in FIG. 1D. Thus, the groove 17 is considered to be formed directly below the lateral surface 20a of the light-emitting element 20.

In the present embodiment, the portion directly below the lateral surface of the pair of the element electrodes 23 and 24 are located close to the inner upper edge 17a of the groove 17, and the portion directly below the lateral surface 20a of the light-emitting element 20 is located above the groove 17. Hence, in the light-emitting device 100, both the self-alignment effect and the light-emission efficiency may be improved.

The term "the upper edge of the groove 17" refers to, a boundary of the upper surface of the plating layer 4 around which a curve of the groove 17 starts and the height from the upper surface of the substrate 2 to the upper surface of the plating layer 4 changes. Specifically, at the curved portion of the groove 17, the upper edge of the groove 17 can be a portion in which the difference in height from the upper surface of the substrate 2 to the upper surface of the plating layer 4 is within a range of 5 μm to 10 μm, more specifically, the difference in height is 5 μm. Also, in another view, the upper edge of the groove 17 can be located directly above the boundary between the plating base layer 3 and the gap portion 16.

The groove 17 surrounding the first region 15 has substantially the same width along a whole periphery except the separate portion 13. The width of the groove 17 can be partly reduced or increased. The width of the groove 17 is preferably 30 μm or more and 150 μm or less. The groove 17 with a width of 30 μm or more allows the reflective material containing layer 30a described below to be readily disposed in the groove 17. The groove with a width of 150 μm or less can reduce the amount of the first covering member 30. The term "the width of the groove 17" as used herein refers to the width of the groove 17 in the region that is located at half the depth from the opening of the groove 17 (i.e., a portion parallel to the upper surface of the plating layer 4). The width of the region from half the depth of the groove 17 to the edge of the groove 17 can be broader than the above width.

The groove 17 preferably has a depth of 15 μm or more and 75 μm or less. The groove 17 with a depth of 15 μm or more allows the reflective material containing layer 30a described below to be readily disposed in the groove 17, and allows the first reflective material to be readily sedimented. The groove with a depth of 75 μm or less can reduce the amount of the first covering member 30. The term "the depth of the groove 17" as used herein refers to the distance from the opening of the groove 17 (i.e., a portion parallel to the upper surface of the plating layer 4) to the deepest portion of the groove 17.

For example, Au, Ag, Cu, Pt, or an alloy containing one of these metals can be used for the plating layer 4. The plating layer 4 formed of any of these materials may further enhance the reflectance of light emitted from the light-emitting element 20 toward the substrate 2.

The plating layer 4 preferably has a thickness of 30 μm or more in view of the heat dissipation, or 100 μm or less in consideration of the self-alignment effect when the light-emitting element 20 is mounted.

The light-emitting element 20 is a semiconductor element that itself emits light when voltage is applied. The light-emitting element 20 in the present embodiment includes a light-transmissive support substrate 21 and a semiconductor layer 22 formed on the support substrate 21 (in the drawing, the light-emitting element 20 is upside down to show a flip-chip mounted element). The support substrate 21 can be formed of an electroconductive substrate as well as an insulating substrate. Any appropriate shape, size, and the like for the light-emitting element 20 can be selected. Any appropriate wavelength can be selected as the emission wavelength of the light-emitting element 20 depending on purpose or use. Examples of a blue (light with wavelengths of 430 nm to 490 nm) or green (light with wavelengths of 495 nm to 565 nm) light-emitting element 20 to be used include a light-emitting element including a nitride semiconductor ($In_XAl_YGa_{1-X-Y}N$, where $0 \leq X$, $0 \leq Y$, and $X+Y \leq 1$) or GaP.

For a red (light with wavelengths of 610 nm to 700 nm) light-emitting element 20, GaAlAs, AlInGaP, or the like can be used besides a nitride semiconductor element.

The thickness of the light-emitting element 20 (such as the height from the lower surface of the support substrate 21 to the upper surface of the semiconductor layer 22) is, for example, 100 μm or more and 300 μm or less.

The light-emitting element 20 includes positive and negative element electrodes 23 and 24 on a surface of the semiconductor layer 22, and is flip-chip mounted on the bottom surface of the recess 18 of the package 10.

The first covering member 30 is a member disposed in the groove 17. The first covering member 30 is formed of a first resin that contains the first reflective material. In the present embodiment, the first covering member 30 includes the reflective material containing layer 30a that contains the first reflective material, and the light-transmissive layer 30b that does not contain the first reflective material in this order from the bottom surface of the groove 17. The reflective material containing layer 30a is disposed in the groove 17. This can inhibit the lateral surface 20a of the light-emitting element 20 from being covered by the reflective material containing layer 30a in the case in which, for example, the pair of element electrodes 23 and 24 have the low height, or the light-emitting element 20 is face-up mounted. This structure can allow light emitted from the light-emitting element 20 to be readily extracted, and may improve the light-emission efficiency of the light-emitting device 100.

In the present embodiment, the first covering member 30 that includes the reflective material containing layer 30a and the light-transmissive layer 30b in this order is formed on the plating layer 4.

The reflective material containing layer 30a is formed by sedimenting the first reflective material. The first reflective material is contained at high concentration in the depth direction of the first covering member 30. The light-transmissive layer 30b is mainly formed of a resin formed by sedimenting the first reflective material. In other words, the light-transmissive layer 30b is formed above the reflective material containing layer 30a, but there is no clear interface between the reflective material containing layer 30a and the light-transmissive layer 30b.

Preferably, the reflective material containing layer 30a does not cover the lateral surfaces 20a of the light-emitting element 20. This structure may improve the light extraction efficiency from the lateral surfaces 20a of the light-emitting element 20. The light-transmissive layer 30b can cover the lateral surfaces 20a of the light-emitting element 20. However, in view of further improving the light extraction efficiency from the lateral surface 20a of the light-emitting element 20, it is preferable that a portion of the light-transmissive layer 30b covering the lateral surface 20a be small.

Examples of the resin material to be used for the first resin include thermosetting resins such as epoxy resins, modified epoxy resins, silicone resins, and modified silicone resins.

The viscosity of the first resin is preferably 0.3 Pa·s or more and 15 Pa·s or less at room temperature (20±5° C.). If the viscosity of the first resin is 0.3 Pa·s or more, the first resin is easily disposed on the bottom surface of the recess 18 by potting. If the viscosity of the first resin is 15 Pa·s or less, the first covering member 30 is easily deformed using a centrifugal force, and sedimentation of the first reflective material is facilitated using a centrifugal force. The viscosity of the first resin is more preferably 0.5 Pa·s or more and 6 Pa·s or less to achieve the above effects.

The above described viscosity of the first resin is the viscosity thereof in which the first light reflective material is contained, in other words, the viscosity before the first reflective material contained in the first resin is sedimented using the centrifugal force as described below.

Examples of the light-reflective material to be used for the first reflective material include titanium oxide, silica, silicon oxide, aluminum oxide, zirconium oxide, magnesium oxide, potassium titanate, zinc oxide, and boron nitride. Among these materials, titanium oxide, which has a comparatively high refractive index, is preferably used in view of reflection of light.

The first reflective material is preferably configured as a substance having a higher specific gravity than the resin material used for the first resin. The difference in specific gravity between the first reflective material and the resin material facilitates sedimentation of the first reflective material in the groove 17 using a centrifugal force. Employing the first reflective material with a large particle diameter allows the first reflective material to be sedimented more quickly in the groove 17.

Use of the centrifugal force allows the first reflective material to be densely disposed and reduces the distances between particles. This can reduce the light leakage and light transmission to thereby increase the light reflectance in the reflective material containing layer 30a.

The particle diameter of the first reflective material is preferably 0.1 µm or more and 1.0 µm or less. With the first reflective material having a particle diameter of 0.1 µm or more, sedimentation of the first reflective material using a centrifugal force is facilitated. With the first reflective material having a particle diameter of 1.0 µm or less, reflection of visible light is facilitated. The particle diameter of the first reflective material is more preferably 0.4 µm or more and 0.6 µm or less, in view of the above description.

The second covering member 40 reflects light emitted from the light-emitting element 20.

The second covering member 40 preferably covers the surfaces of the recess 18 other than the portions of the plating base layer 3, plating layer 4, and the first covering member 30 so as to inhibit light emitted from the light-emitting element 20 from being transmitted through or absorbed in at the bottom surface or the lateral surfaces of the recess 18 of the package 10. In the present embodiment, the light-emitting element 20 is flip-chip mounted on the bottom surface of the recess 18 of the package 10, and the second covering member 40 is not disposed at the separate portion 13 on the lower surface of the light-emitting element 20 (see FIGS. 3A and 3B). Hence, the first covering member 30 is disposed at the separate portion 13 on the lower surface of the light-emitting element 20.

The second covering member 40 is formed to cover the lateral surface of the recess 18 of the package 10. Also, the second covering member 40 continuously covers from the lateral surface of the recess 18 to the portion of the upper surface of the plating layer 4. In the present embodiment, the second covering member 40 is formed to continuously cover from the upper edge of the lateral surface of the recess 18 to the portion close to the outer edge of the upper surface of the plating layer 4. Also, the second covering member 40 is formed from the upper edge of the lateral surface of the recess 18 to the portion close to the outer edge of the plating layer 4. The thickness of the second covering member 40 is gradually reduced toward to the outer edge of the plating layer 4. The second covering member 40 can be disposed such that the entire upper surface of the plating layer 4 is exposed from the second covering member 40. Alternatively, in view of easy disposition, the second covering member 40 can cover a portion of the upper surface of the plating layer 4. The second covering member 40 can continuously cover from the upper edge of the lateral surface of the recess 18 to the outer upper edge 17b of the groove 17. The second covering member 40 is formed of a second resin that contains the second reflective material. The second covering member 40 more preferably covers substantially the entire lateral surface of the recess 18 in the height direction, and more preferably covers the lateral surface of the recess 18 at least such that the upper edge of the second reflective material is located above the upper surface of the light-emitting element 20 in a cross-sectional view of the light-emitting device 100.

In the second covering member 40, the second reflective material is dispersed in the second resin. The statement "the second reflective material is dispersed in the second resin" as used herein encompasses that the reflective material is dispersed to such an extent that it functions as a reflective layer. For example, the state of the dispersion created by applying a resin containing a reflective material using a conventionally known method is sufficient. The second reflective material can be partially concentrated as long as the second covering member 40 functions as a reflective layer.

The concentration of the second reflective material in the second covering member 40 is, for example, 10 mass % or more and 50 mass % or less.

The second covering member 40 covering the bottom surface and the lateral surface of the recess 18 of the package 10 can inhibit light from transmitting through or absorbed in the bottom surface and the lateral surface of the recess 18.

Examples of the resin material to be used for the second resin include thermosetting resins such as epoxy resins, modified epoxy resins, silicone resins, and modified silicone resins. Examples of the light-reflective material to be used for the second reflective material include titanium oxide, silica, silicon oxide, aluminum oxide, zirconium oxide, magnesium oxide, potassium titanate, zinc oxide, and boron nitride. Among these materials, titanium oxide, which has a comparatively high refractive index, is preferably used in view of reflection of light.

The light-transmissive member 50 is formed on the first covering member 30, the upper surface and the lateral surfaces 20a of the light-emitting element 20, and the second covering member 40. The light-transmissive member 50 is formed of a light-transmissive resin.

Examples of the resin material to be used for the light-transmissive member 50 include thermosetting resins such as epoxy resins, modified epoxy resins, silicone resins, and modified silicone resins. The resin material used for the light-transmissive member 50 can be the same as or different from the resin material for the first resin and the second resin. A resin having high resistance to heat can be used for the first resin and the second resin, and a hard resin can be used for the light-transmissive member 50.

The first resin is preferably softer than the resin for the light-transmissive member 50. As the first resin is disposed near the area in which the light-emitting element 20 is bonded to the substrate 2, it is preferable to employ a material that is unlikely to expand with heat and is flexible with heat so as to inhibit excessive stress caused by thermal expansion.

A silicone resin is generally more resistant to light in approximately 450 nm or more and 500 nm or less than an epoxy resin, and an epoxy resin is harder than a silicone resin. Hence, a silicone resin can be used for the first resin and the second resin, and an epoxy resin can be used for the light-transmissive member 50.

The light-transmissive member 50 can contain a wavelength conversion material. Examples of the wavelength conversion material include phosphors. The light-transmissive member 50 can contain a filler such as a diffusing material according to purpose.

A substance known in the art of the disclosure can be used for the phosphor. For example, a yellow phosphor such as YAG ($Y_3Al_5O_{12}$:Ce) and silicates, a red phosphor such as CASN ($CaAlSiN_3$:Eu) and KSF ($K_2SiF_6$:Mn), or a green phosphor such as chlorosilicates and $BaSiO_4$:$Eu^{2+}$ can be used.

A substance known in the art of the disclosure can be used for the diffusing material. For example, barium titanate, titanium oxide, aluminum oxide, or silicon oxide can be used.

Operation of Light-Emitting Device

When the light-emitting device 100 operates, an electric current is supplied from an external power supply to the light-emitting element 20 via the wiring pattern 6, and the light-emitting element 20 emits light. Light emitted from the light emitting element 20 and traveling upward is extracted from the upper side of the light emitting device 100 to the outside. Light emitted from the light emitting element 20 and traveling downward is reflected by the reflective material containing layer 30a and the second covering member 40 and is extracted from the opening of the recess 18 of the package 10 to the outside of the light-emitting device 100. Light emitted from the light-emitting element 20 and traveling laterally is reflected by the second covering member 40 and is extracted from the opening of the recess 18 of the package 10 to the outside of the light-emitting device 100. Accordingly, light emitted from the light-emitting element 20 is unlikely to leak from the bottom surface and the lateral surface of the recess 18 to the extent possible, and the light extraction efficiency of the light-emitting device 100 is increased. In the case in which the light-transmissive member 50 contains the wavelength conversion material, the wavelength conversion material is also disposed on the lateral surface of the light-emitting element 20 that is exposed from the reflective material containing layer 30a. This may reduce non-uniformity in emission color of the light-emitting device 100. The light-emitting device 100 includes the reflective material containing layer 30a in the groove 17, and the lateral surface of the light-emitting element 20 is exposed from the reflective material containing layer 30a. This may allow the extraction efficiency and light-emission efficiency to be increased.

Method of Manufacturing Light-Emitting Device 100

Next, an example of a method of manufacturing the light-emitting device according to one embodiment will be described.

Figure 2:
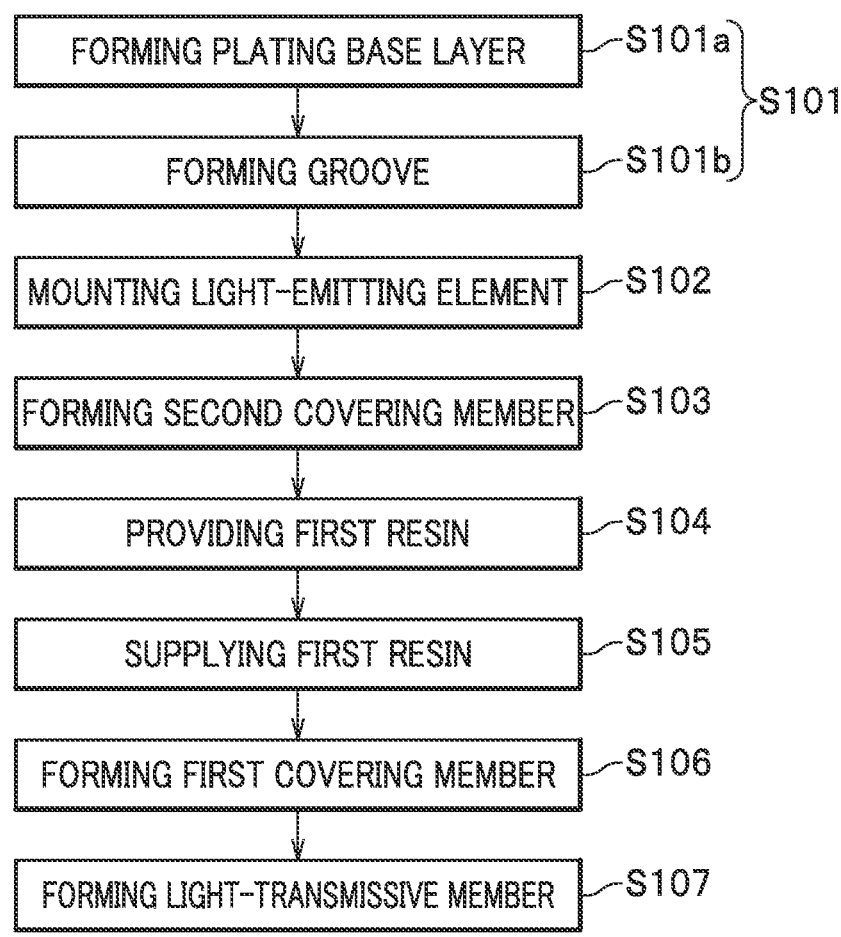
FIG. 2 is a flowchart illustrating a method of manufacturing the light-emitting device according to the embodiment.
Figure 4B:
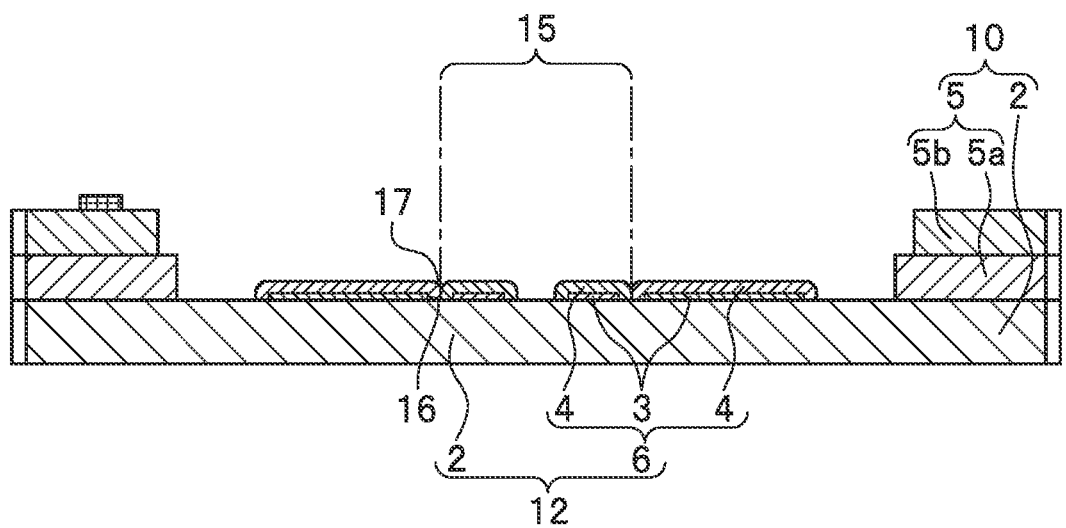
FIG. 4B is a schematic cross-sectional view taken along the line IVB-IVB of FIG. 4A illustrating the step of forming the groove in the method of manufacturing the light-emitting device according to the embodiment.
Figure 5A:
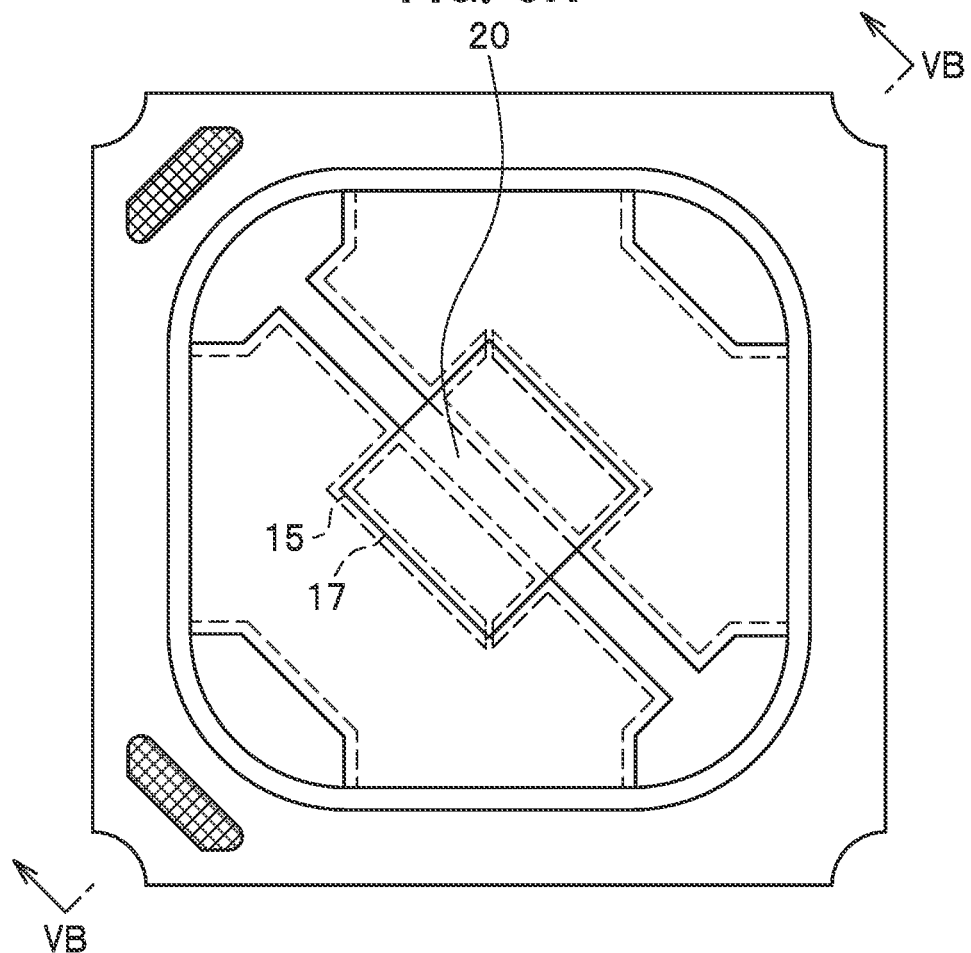
FIG. 5A is a schematic top view illustrating a step of mounting a light-emitting element in the method of manufacturing the light-emitting device according to the embodiment.
Figure 5B:
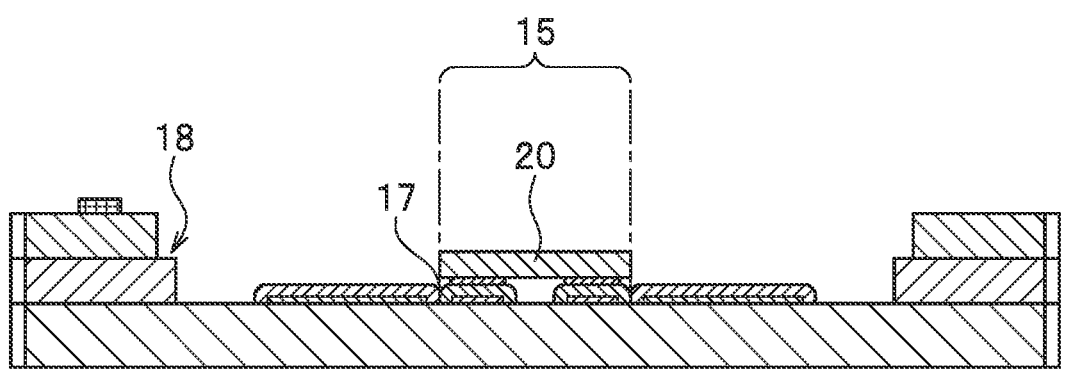
FIG. 5B is a schematic cross-sectional view taken along the line VB-VB of FIG. 5A illustrating the step of mounting the light-emitting element in the method of manufacturing the light-emitting device according to the embodiment.
Figure 6A:
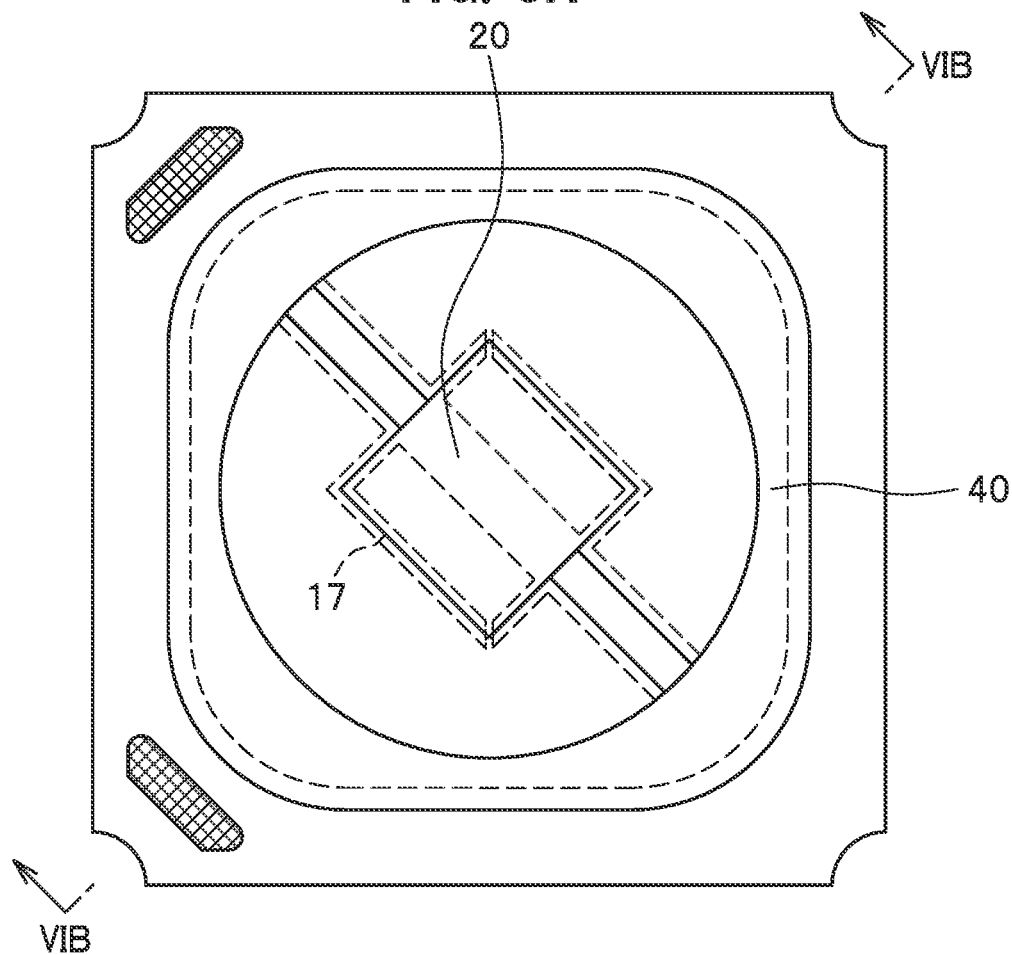
FIG. 6A is a schematic top view illustrating a step of forming a second covering member in the method of manufacturing the light-emitting device according to the embodiment.
Figure 6B:
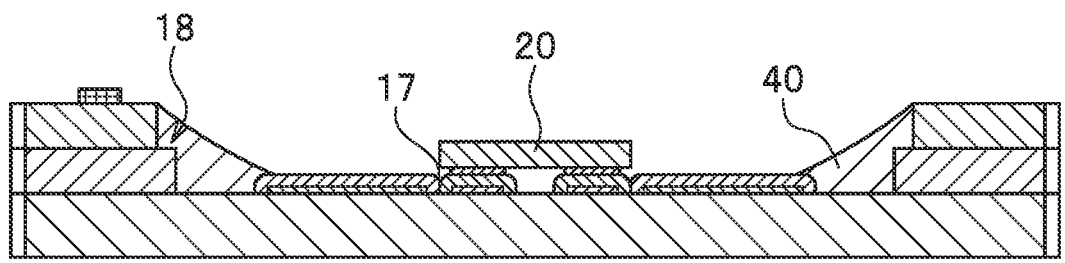
FIG. 6B is a schematic cross-sectional view taken along the line VIB-VIB of FIG. 6A illustrating the step of forming the second covering member in the method of manufacturing the light-emitting device according to the embodiment.
Figure 7A:
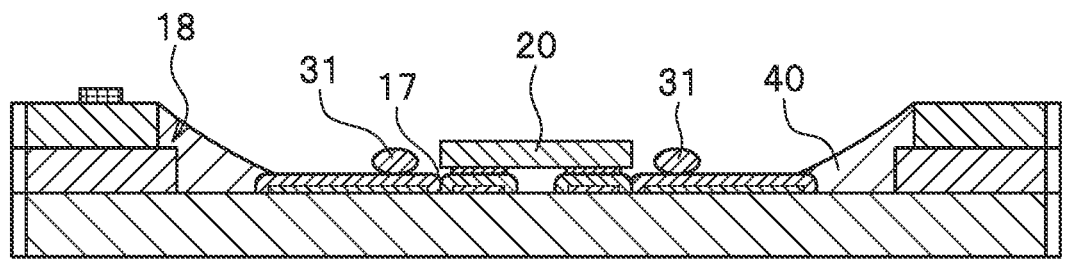
FIG. 7A is a schematic cross-sectional view illustrating a step of supplying a first resin in the method of manufacturing the light-emitting device according to the embodiment.
Figure 7B:
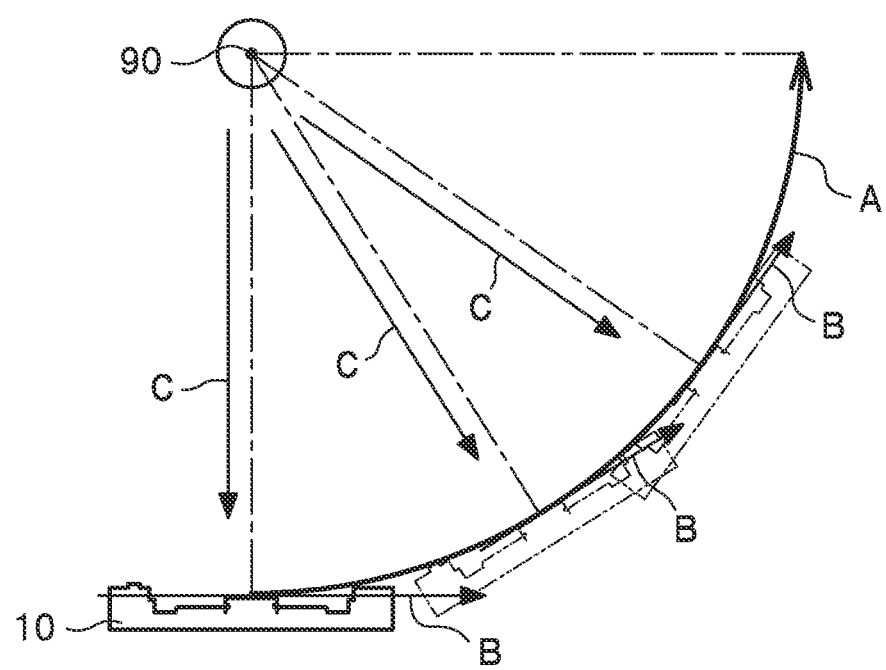
FIG. 7B is a schematic diagram showing a step of sedimenting a first reflective material using a centrifugal force in a step of forming a first covering member in the method of manufacturing the light-emitting device according to the embodiment.
Figure 7C:
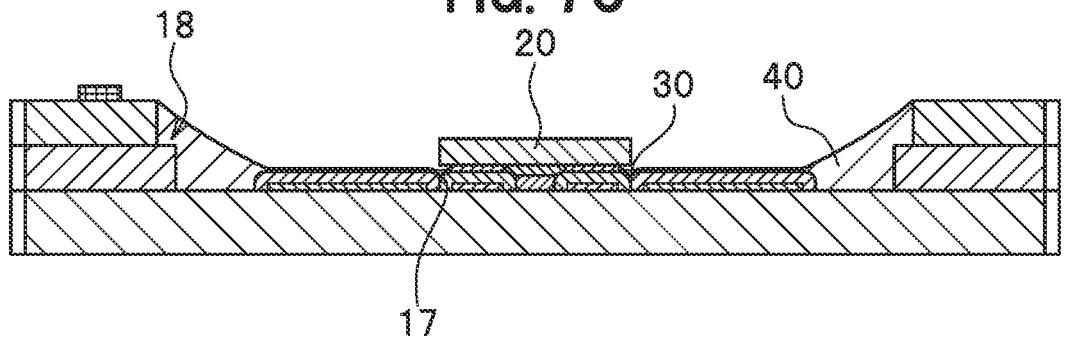
FIG. 7C is a schematic cross-sectional view after the first reflective material has been sedimented using the centrifugal force in the step of forming the first covering member in the method of manufacturing the light-emitting device according to the embodiment.
Figure 7D:
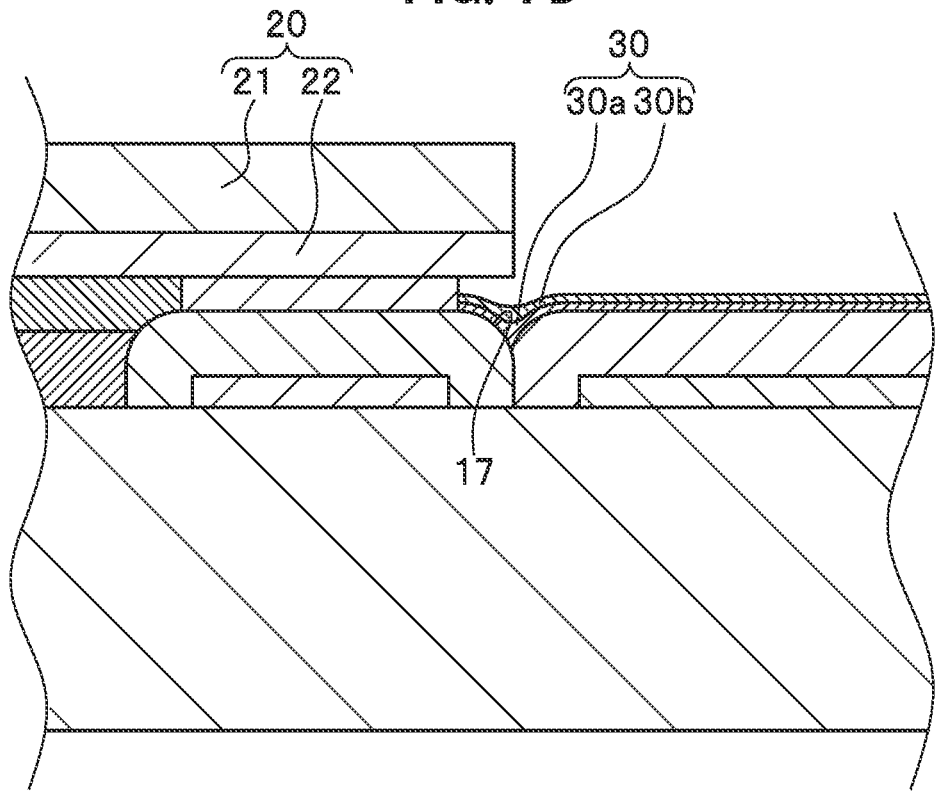
FIG. 7D is a schematic cross-sectional view illustrating a portion of the structure shown in FIG. 7C.
Figure 7E:
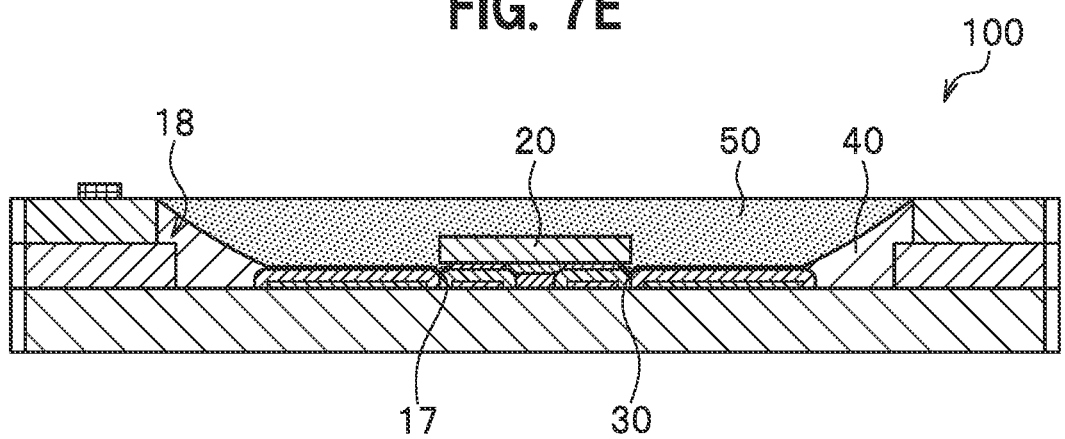
FIG. 7E is a schematic cross-sectional view illustrating a step of forming a light-transmissive member in the method of manufacturing the light-emitting device according to the embodiment.

FIG. 2 is a flowchart illustrating a method of manufacturing the light-emitting device according to the embodiment. FIG. 3A is a schematic top view illustrating a step of forming a plating base layer in the method of manufacturing the light-emitting device according to the embodiment. FIG. 3B is a schematic cross-sectional view taken along the line IIIB-IIIB of FIG. 3A illustrating the step of forming the plating base layer in the method of manufacturing the light-emitting device according to the embodiment. FIG. 4A is a schematic top view illustrating a step of forming a groove in the method of manufacturing the light-emitting device according to the embodiment. FIG. 4B is a schematic cross-sectional view taken along the line IVB-IVB of FIG. 4A illustrating the step of forming the groove in the method of manufacturing the light-emitting device according to the embodiment. FIG. 5A is a schematic top view illustrating a step of mounting a light-emitting element in the method of manufacturing the light-emitting device according to the embodiment. FIG. 5B is a schematic cross-sectional view taken along the line VB-VB of FIG. 5A illustrating the step of mounting the light-emitting element in the method of manufacturing the light-emitting device according to the embodiment. FIG. 6A is a schematic top view illustrating a step of forming a second covering member in the method of manufacturing the light-emitting device according to the embodiment. FIG. 6B is a schematic cross-sectional view taken along the line VIB-VIB of FIG. 6A illustrating the step of forming the second covering member in the method of manufacturing the light-emitting device according to the embodiment. FIG. 7A is a schematic cross-sectional view illustrating a step of supplying a first resin in the method of manufacturing the light-emitting device according to the embodiment. FIG. 7B is a schematic diagram showing a step of sedimenting a first reflective material using a centrifugal force in a step of forming a first covering member in the method of manufacturing the light-emitting device according to the embodiment. FIG. 7C is a schematic cross-sectional view after the first reflective material has been sedimented using the centrifugal force in the step of forming the first covering member in the method of manufacturing the light-emitting device according to the embodiment. FIG. 7D is a schematic cross-sectional view illustrating a portion of the structure shown in FIG. 7C. FIG. 7E is a schematic cross-sectional view illustrating a step of forming a light-transmissive member in the method of manufacturing the light-emitting device according to the embodiment. In FIGS. 3A, 4A, 5A, and 6A, the deepest portion of a groove is indicated by a reference numeral 17.

A method of manufacturing a light-emitting device 100 includes a step S101 of providing a wiring board 12, a step S102 of mounting the light-emitting element 20, a step S103 of forming a second covering member 40, a step S104 of providing a first resin, a step S105 of supplying a first resin, a step S106 of forming a first covering member 30, and a step S107 of forming a light-transmissive member 50. The step S101 of providing a wiring board 12 provides a wiring board 12 including a substrate 2 and a wiring pattern 6. The wiring pattern 6 includes a plating base layer 3 disposed on the substrate 2 so as to have a gap portion 16 surrounding a first region 15 in which a light-emitting element 20 is mounted, and a plating layer 4 having a groove 17 that surrounds the first region 15. In the step S102 of mounting the light-emitting element 20, the light-emitting element 20 is mounted in the first region 15. In the step S103 of forming the second covering member 40, the second covering member 40 is formed of a second resin that continuously covers from lateral surface(s) of a recess 18 to a portion of an upper surface of the plating layer 4. In the step S105 of supplying the first resin, the first resin containing a first reflective material is supplied into the groove 17. The step S106 of forming the first covering member 30 includes sedimenting the first reflective material contained in the first resin by applying a centrifugal force to the first resin, so that the first covering member 30 includes: a reflective material containing layer 30a that contains the first reflective material, and is formed in the groove 17; and a light-transmissive layer 30b formed above the reflective material containing layer 30a. In the step S107 of forming the light-transmissive member 50, the light transmissive member 50 is formed on the first covering member 30 and the light-emitting element 20.

The step S101 of providing the wiring board includes a step S101a of forming the plating base layer and a step of S101b of forming the groove 17. In the step 101Sa of forming the plating base layer, the plating base 3 is disposed on the substrate 2 so as to have the gap portion 16 surrounding the first region 15 in which a light-emitting element 20 is mounted. In the step S101b of forming the groove 17, the groove 17 of the plating layer 4 is formed at the gap portion 16 by forming the plating layer 4 on the plating base layer 3.

The material and arrangement of each member are substantially the same as or a similar to those described for the light-emitting device 100, and their descriptions are omitted as appropriate.

Providing Wiring Board

In the step S101 of providing the wiring board, the wiring board 12 including the substrate 2 and the wiring pattern 6 is provided. The wiring pattern 6 includes the plating base layer 3 disposed on the substrate 2 so as to have the gap portion 16 surrounding the first region 15 in which a light-emitting element 20 is mounted, and the plating layer 4 having the groove 17 that surrounds the first region 15. The step S101 includes the step S101a of forming the plating base layer and the step S101b of forming the groove.

In the step S101, the package 10 having the recess 18 is provided. The recess has a bottom surface defined by the substrate 2 and lateral surface(s) defined by the lateral wall 5 that surrounds the bottom surface.

In the step S101, in the step S101a, the plating base layer 3 is disposed on the substrate 2 so as to have the gap portion 16 surrounding the first region 15 in which the light-emitting element 20 is mounted. In the step S101, the plating base layer 3 is formed to have a separate portion 13 at the center of the bottom surface of the package 10. The plating base layer 3 can be formed by, for example, sputtering or vacuum deposition.

Subsequently, in the step S101b of forming the groove, the plating layer 4 is formed on the plating base layer 3. At this time, the plating layer 4 is formed to have such a thickness that allows the plating layers 4 covering the lateral surfaces of the plating base layer 3 to be in contact with each other in the gap portion 16. In this structure, the gap portion 16 is covered with the plating layer 4, and the groove 17 of the plating layer 4 is formed above the gap portion 16. The plating layer 4 can be formed by electroless plating or electroplating.

In the case in which the plating layer 4 is formed by electroplating, it is preferable that a plurality of the gap portions 16 be formed intermittently and that the plating base layer 3 disposed in the first region 15 and the plating base layer 3 disposed in a region other than the first region 15 be partly connected to each other, as shown in FIG. 3A. In the case in which the gap portion 16 is a single continuous gap portion that surrounds the first region 15, that is, the plating base layer 3 is formed in shape of islands in the first region 15, the plating layer 4 can be formed by electroless plating. Also, the plating base layer 3 disposed in the first region 15 and the plating base layer 3 disposed in a region other than the first region 15 can be electrically connected to each other via an inner layer wiring.

In the step S101, the package 10 that includes the wiring board 12 already having the wiring pattern 6 can be provided.

Mounting Light-Emitting Element

In the step S102 of mounting the light-emitting element, the light-emitting element 20 is mounted in the first region 15.

In the step S102, the light-emitting element 20 is mounted on the bottom surface of the recess 18 of the package 10. The light-emitting element 20 includes an electrode-formed surface serving as a mounting surface and is flip-chip mounted on the bottom surface of the recess 18 via an electroconductive adhesive material. Examples of the electroconductive adhesive material include eutectic solder, electroconductive paste, and bumps. The light-emitting element 20 can be face-up mounted. In this case, a non-conductive adhesive material can be used.

Forming Second Covering Member

In the step S103 of forming the second covering member, a second covering member 40 is formed by continuously covering from the lateral surface of the recess 18 to the portion of the upper surface of the plating layer 4 with the second resin.

In the step S103, the second resin for covering the lateral surface of the recess 18 is disposed by, for example, potting. The second resin can be disposed in the recess 18 by discharging the uncured resin material from a nozzle of a tip of a resin discharging device filled with the second resin onto the vicinity of the outer edge of the bottom surface of the recess 18 (preferably onto the boundary between the lateral surface and the bottom surface of the recess 18). The uncured second resin spreads over the lateral surface of the recess 18 and covers the lateral surface of the recess 18. At this time, the second resin also flows onto the bottom surface of the recess 18 and covers a portion of the bottom surface of the recess 18. The amount, viscosity, and positions of the second resin are preferably adjusted such that the second resin flowing on the bottom surface of the recess 18 does not reach and spread in the groove 17, but creeps up to the upper portion of the lateral surface of the recess 18. In the case in which the second covering member 40 is formed by potting, the viscosity of the second resin is adjusted to be, for example, 1 Pa·s or more and 50 Pa·s or less at room temperature (20±5° C.). Preferably, the second resin does not cover the inside of the groove 17.

The inner surface of the recess 18 of the package 10 can be preliminarily immersed in an organic solvent. Preliminarily immersing the inner surfaces of the recess 18 in the organic solvent can facilitate the creep up of the second resin on the lateral surface of the recess 18. Also, the creep up of the second resin on the lateral surface of the recess 18 can be facilitated by employing a material having high wettability as the lateral surface of the recess 18, applying a material having high wettability on the lateral surface of the recess 18, or roughening the lateral surface.

The uncured second resin contains the second reflective material, and the concentration of the second reflective material in the second resin is preferably 10 mass % or more and 50 mass % or less.

The second resin is disposed near the outer edges of the bottom surface of the recess 18 by potting. This allows the second resin to spread over the lateral surfaces of the recess 18. At this time, the second covering member 40 is in a state in which the second reflective material is dispersed in the second resin.

Thereafter, for example, the second resin is cured at a temperature of 120° C. to 200° C. to form the second covering member 40. It is preferable that the second resin be cured with the package 10 motionless after the second resin has spread over the lateral surfaces of the recess 18.

Providing First Resin

In the step S104 of providing the first resin, a base component of a two-part curable resin material is mixed with the first reflective material, and a hardener is mixed after a certain period of time has passed.

Using the first resin produced as above may enhance the compatibility between the first reflective material and the resin material, and facilitates sedimentation of the first reflective material using the centrifugal force. The temperature before the hardener is mixed is approximately equal to room temperature.

Examples of the two-part curable resin material include silicone resins, modified silicone resins, epoxy resins, and modified epoxy resins.

The period of time after the base component of the two-part curable resin material is mixed with the first reflective material is preferably two hours or more to facilitate sedimentation of the first reflective material. Also, the period of time is preferably eight hours or less to reduce manufacturing time. After the hardener is mixed, the subsequent step is started before the first resin is cured.

The concentration of the first reflective material in the uncured first resin is, for example, approximately 15 mass % or more and 60 mass % or less.

Supplying First Resin

In the step S105 of supplying the first resin, the first resin 31 containing the first reflective material is supplied in the groove 17 is supplied.

In the step S105, the uncured first resin 31 is disposed onto the plating layer 4 by, for example, potting. Specifically, the uncured first resin 31 is disposed onto a portion of the plating layer 4 close to the groove 17. The uncured first resin disposed onto a portion of the plating layer 4 close to the groove 17 flows into the groove 17 to be supplied into the groove 17. The uncured first resin 31 is, for example, preferably disposed at two locations close to the lateral surfaces of the light-emitting element 20 that are opposite to each other, and allows the first resin to flow into the groove 17 using the weight of the first resin or using the centrifugal force so as to be supplied into the groove 17. In this manner, the first resin flown into the groove 17 moves in the groove 17 in a direction in which the groove 17 elongates on the bottom surface of the recess 18. This can inhibit the first resin from spreading in a vertical direction (i.e., a direction from the deepest portion of the groove to the bottom surface of the recess 18) before the first resin is spread in the groove 17.

That is, the flow of the first resin toward the pair of element electrodes 23, 24 or toward the light-emitting element 20 is suppressed by not potting the first resin 31 directly in the groove 17. This can inhibit, for example, the first resin from creeping up to the lateral surfaces 20a of the light-emitting element 20 before centrifugal rotation in the case in which the pair of element electrodes 23, 24 have a lower height or the light-emitting element 20 is face-up mounted. Creeping up of the first resin on the lateral surfaces 20a of the light-emitting element 20 is inhibited by deformation of the first resin due to centrifugal rotation, however, the first reflective material in the first resin may remain on the lateral surfaces 20a of the light-emitting element 20 due to the viscosity of the first resin and the speed of centrifugal rotation. Hence, the first resin preferably does not cover the lateral surface 20a of the light-emitting element 20 before centrifugal rotation.

In the case in which the first resin does not readily flow into the groove 17 due to the viscosity of the resin and the like, the first resin 31 can be disposed directly in the groove 17 by potting and the like.

Forming First Covering Member

In the step S106 of forming the first covering member, a centrifugal force is applied to the first resin to sediment the first reflective material contained in the first resin, so that the first covering member 30 includes: the reflective material containing layer 30a that contains a first reflective material, and is formed; and a light-transmissive layer 30b formed above the reflective material containing layer 30a, in the groove 17.

In the step S106, the substrate 2, that is, the package 10 is subjected to centrifugal rotation in such a direction that the centrifugal force is applied to the bottom surface of the recess 18. This allows the centrifugal force to be applied to the substrate 2 on which the first resin is disposed in the groove 17. By forcibly sedimenting the first reflective material in the first resin toward the bottom surface of the recess 18 using the centrifugal force, the reflective material containing layer 30a in which the first reflective material is densely disposed as a sedimentation layer of the first reflective material is formed as well as the light-transmissive layer 30b as the supernatant fluid. By forming the reflective material containing layer 30a by centrifugal sedimentation as described above, the particles of the first reflective material can be densely disposed at the bottom surface while reducing the content of the first reflective material in the first resin. This can form the reflective material containing layer 30a and the light-transmissive layer 30b formed above the reflective material containing layer 30a, formed in the groove 17.

In the step S105 of supplying the first resin, in the case of making the first resin flow into the groove 17 by a centrifugal force, the centrifugal rotation to make the first resin flow into the groove 17 and the centrifugal rotation in the step S106 can be commonly performed.

As shown in FIG. 7B, the rotation of the package 10 is preferably performed by applying the centrifugal force to the package 10 around a central axis 90 such that the upper surface of the substrate 2, that is, the bottom surface of the recess 18 is located outside. Specifically, the package 10 is moved in a direction A that revolves around the central axis 90 located at the upper surface side of the package 10. A direction B in FIG. 7B is parallel to the bottom surface of the recess 18. In FIG. 7B, three examples of the direction B are shown along with the movement of the package 10, but the movement is actually continuous.

The central axis 90 is an axis parallel to the bottom surface of the recess 18 located on a perpendicular line passing through a substantially center of the bottom surface of the recess 18, and faces the opening of the recess 18 of the package 10. Accordingly, the centrifugal force is applied in the direction toward the bottom surface of the recess 18, to thereby reduce the spread of the first resin in the height direction of the package 10 and to forcibly sediment the first reflective material contained in the first resin toward the bottom surface (in the direction of an arrow C in FIG. 7B) of the recess 18. Curing of the first resin is performed in the above condition, and then the reflective material containing layer 30a that contains the first reflective material and the transmissive layer 30b are formed at the groove 17 in this order from the bottom surface of the recess 18.

The first covering member 30 that includes the reflective material containing layer 30a and the light-transmissive layer 30b layered in this order is formed also on the plating layer 4.

The amount of the first covering member 30 to be applied and the content of the first reflective material in the first resin are appropriately adjusted.

The speed of rotation and the number of revolutions in the centrifugal rotation of the package 10 vary according to the content and particle diameter of the first reflective material, however, the number of revolutions and the radius of gyration can be adjusted such that, for example, a centrifugal force of 200×g or more is applied.

The package 10 can be subjected to centrifugal rotation in the state of an undivided substrate before being singulated in the manufacturing steps. In this case, if the undivided substrate is a flat plate, as the plane area of the undivided substrate is larger (more specifically, as the length of the substrate in the direction A of rotation is greater), a portion of a package 10 far from the center of the undivided substrate is likely to deviate with respect to the central axis 90. For example, if the deviation from the circumference of the circle of revolution toward the direction B in the undivided substrate is large, the surface of the first resin is inclined relative to the bottom surface of the recess 18, possibly resulting in variation in the states of the surfaces of the first resin in the undivided substrate. The deviation can be reduced by increasing the radius of gyration. Specifically, the deviation can be reduced by employing a radius of gyration that is 70 times or more as large as the length of the undivided substrate in the direction of rotation.

The package 10 can be formed of a flexible resin substrate that is bent along the circumference of the circle of the radius of gyration by the centrifugal force, as the undivided substrate. In this case, the above-described deviation is unlikely to occur. Accordingly, an undivided substrate formed of the flexible package 10 can have a larger size to be applied to a centrifugal force compare to the case of employing an undivided substrate formed of a non-flexible package 10. The number of substrates to be treated at a time can be thus increased. Examples of the flexible undivided substrate include resin packages connected by leads.

In the step S106, the first resin is preferably cured while performing sedimentation of the first reflective material, that is, while under the centrifugal force. The first reflective material preferably has a small particle diameter, but the smaller the particle diameter is, the more difficult the sedimentation becomes. Hence, the first reflective material is forcibly sedimented using the centrifugal force toward the bottom surface of the recess 18 in this step S106. In order to perform curing in the state in which the first reflective material is sedimented, in this step S106, curing the first resin is preferably performed while maintaining the rotation, in other words, under rotation.

It is possible to perform curing after stopping the rotation, but without the rotation, the resin is likely to spread over the lateral surfaces 20a of the light-emitting element 20 due to wettability in the case in which, for example, the pair of element electrodes 23 and 24 have a lower height, or the light-emitting element 20 is face-up mounted. Hence, curing the first resin under rotation of the package 10 can inhibit the first resin from creeping up the lateral surface 20a of the light-emitting element 20. With the lateral surface 20a of the light-emitting element 20 being exposed from the first resin, the light extraction efficiency may be further improved.

At this time, the temperature during the curing of the first resin is, for example, 40° C. or higher and 200° C. or lower. By raising the temperature during the curing, the first resin can be efficiently cured in a short period of time. The temperature during the curing is preferably as low as possible in consideration of shifting of the central axis 90 due to thermal expansion of metal parts of a centrifuge. In other words, the temperature during the curing of the first resin is preferably 50° C. or higher in view of efficiency. The temperature during the curing of the first resin is preferably 60° C. or lower in consideration of shifting of the central axis 90. In the case in which the curing is performed at 80° C. or higher, the centrifuge is preferably controlled so that the temperature of at least metal parts of the centrifuge will not be 80° C. or higher.

The first resin is preferably configured as a resin material that can be at least semi-cured by keeping the temperature of the rotated package 10 at 40° C. or higher.

Curing the first resin while sedimenting the first reflective material can be performed with, for example, hot blown air or a panel heater.

Forming Light-Transmissive Member

In the step S107 of forming the light-transmissive member, the light-transmissive member 50 is formed on the first covering member 30, the second covering member 40, and the light-emitting element 20.

In the step S107, the resin for the light-transmissive member 50 is formed in the recess 18 by, for example, potting or spraying. Thereafter, for example, the resin of the light-transmissive member 50 is cured at a temperature of 120° C. or higher and 200° C. or lower to form the light-transmissive member 50.

Other Embodiments

Figure 8:
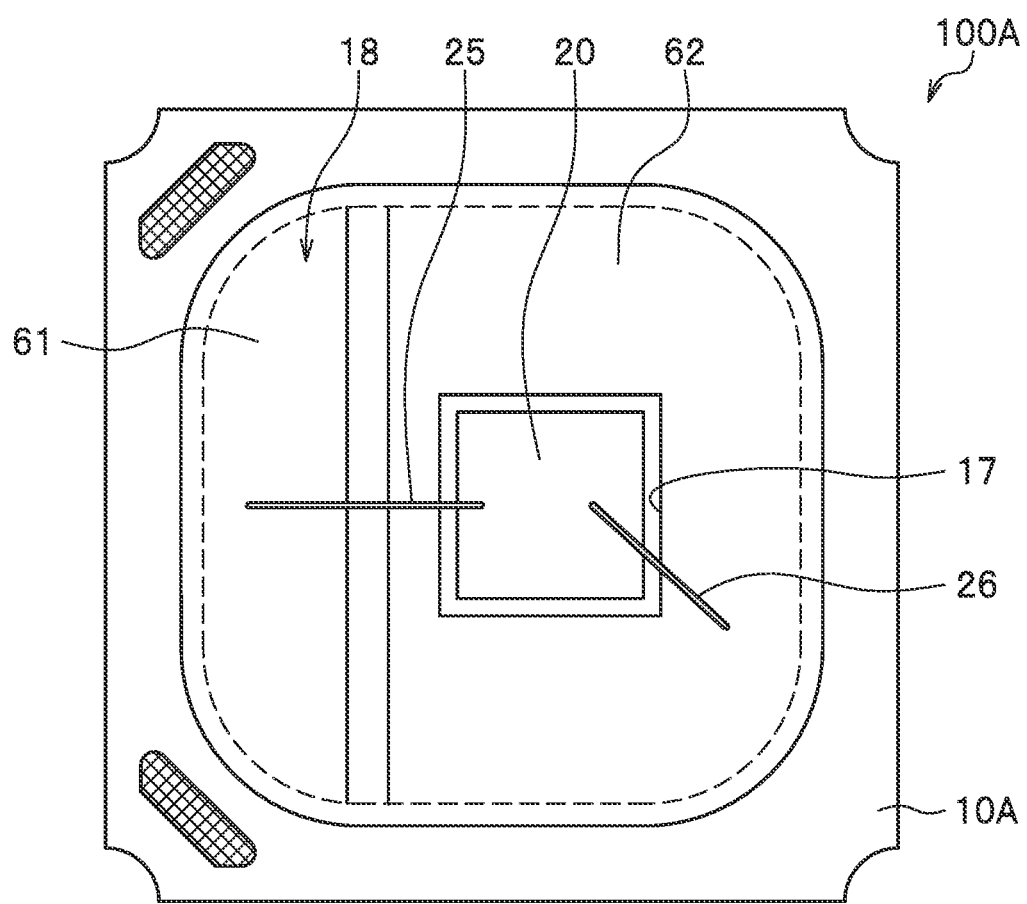
FIG. 8 is a partially shown through top view schematically illustrating the structure of a light-emitting device according to another embodiment.
Figure 9A:
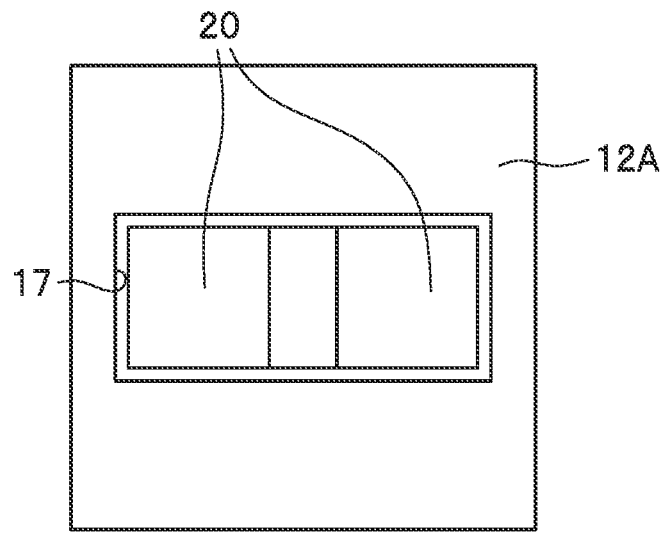
FIG. 9A is a schematic top view illustrating the structure of grooves of a light-emitting device according to still another embodiment.
Figure 9B:
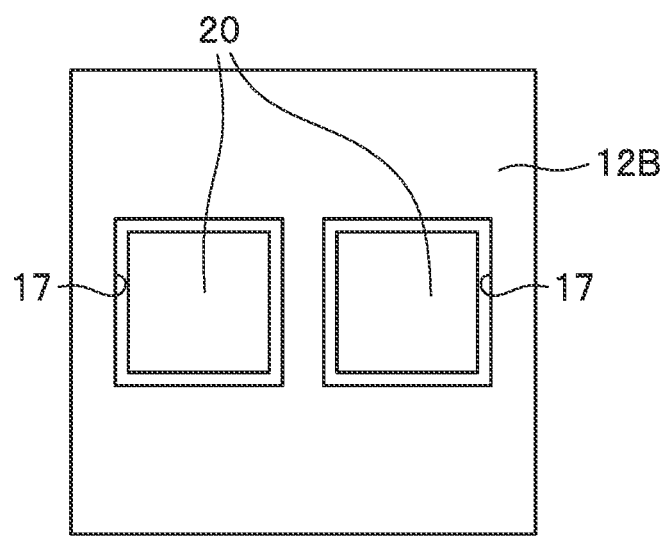
FIG. 9B is a schematic top view illustrating the structure of grooves of a light-emitting device according to still another embodiment.

FIG. 8 is a partially shown through top view schematically illustrating the structure of a light-emitting device according to another embodiment. FIG. 9A is a schematic top view illustrating the structure of grooves of a light-emitting device according to still another embodiment. FIG. 9B is a schematic top view illustrating the structure of grooves of a light-emitting device according to still another embodiment. In FIGS. 8, 9A, and 9B, the structure of the groove is simply illustrated.

A light-emitting device 100A shown in FIG. 8 includes a light-emitting element 20 that is face-up mounted on the bottom surface of a recess 18 of a package 10A. The light-emitting element 20 is mounted on a second lead 62 of a pair of positive and negative lead electrodes. In the present embodiment, an n-side electrode of the light-emitting element 20 is bonded to a first lead 61 via a wire 25, and a p-side electrode is bonded to the second lead 62 via a wire 26. The electrode-formed surface of the light-emitting element 20 is disposed on an upper surface opposite to the mounting surface. This structure allows a portion directly below the lateral surface of the light-emitting element 20 to be located at the inner upper edge of a groove 17. Hence, both the self-alignment effect and the light-emission efficiency may be improved. In the case in which the light-emitting element 20 is flip-chip mounted, the light-emitting element 20 is preferably raised up in the height direction by using submounts, bumps, or post electrodes for the pedestals. In the case in which the light-emitting element 20 is flip-chip mounted, the semiconductor layer faces the bottom surface of the recess of the package (or faces the substrate of the light-emitting device 100A). With the light-emitting element 20 raised up in the height direction, a portion of or the whole lateral surfaces of the semiconductor layer can be free from coverage by the first covering member.

The light-emitting device can include a plurality of light-emitting elements 20. For example, in the case of including two light-emitting elements 20, as shown in FIG. 9A, a single groove 17 on a wiring board 12A can be formed in a rectangular annular shape that surrounds both of two light-emitting elements 20 in a top view. Alternatively, as shown in FIG. 9B, grooves 17 each having a rectangular annular shape can be formed on a wiring board 12B so as to respectively surrounds two light-emitting elements 20 in a top view.

The method of manufacturing the light-emitting device can include additional steps between the described steps or before or after the described steps, as long as the additional steps do not adversely affect the described steps. For example, the method can include a foreign matter removal step of removing foreign matters mixed during manufacture.

In the method of manufacturing the light-emitting device, the order of some steps is not limited thereto, and can be changed. For example, in the aforementioned method of manufacturing the light-emitting device, the step of forming a first resin is performed after the step of forming the second covering member. However, the step of providing the first resin can be performed before the step of forming the second covering member, can be performed before the step of mounting the light-emitting element, can be performed before the step of forming the groove, or can be performed before the step of forming the plating base layer. Also, the step of providing the first resin can be omitted.

The step of forming a second covering member is performed after the step of mounting the light-emitting element and before the step of forming the first resin in the above description. However, the step of forming the second covering member can be performed before the step of mounting the light-emitting element, or can be performed after the step of forming the first covering member and before the step of forming the light-transmissive member.

Element Mounting Wiring Board

The element mounting wiring board includes a substrate and a wiring pattern, the wiring pattern including a plating base layer disposed on the substrate so as to include a gap portion that surrounds a first region in which the light-emitting element is mounted, and a plating layer that has a groove surrounding the first region.

Descriptions of the element mounting wiring board is omitted here because the element mounting wiring board is substantially the same as or similar to the wiring board 12 described in the light-emitting device 100.

Method of Manufacturing Element Mounting Wiring Board

A method of manufacturing an element mounting wiring board includes: a step of forming a plating base layer on a substrate so as to have a gap portion that surrounds a first region in which a light-emitting element is mounted, and a step of forming a groove of a plating layer at the gap portion, the plating layer being formed on the plating base layer.

Descriptions of the steps of forming the plating base layer and forming the groove are omitted because the step is substantially the same as or similar to the step S101a of forming the plating base layer and the step S101b of forming the groove described in the step S101 of providing the wiring board.

Certain embodiments of the method of manufacturing the light-emitting device, the light-emitting device, the element mounting wiring board, and the method of manufacturing the element mounting wiring board have been specifically described, but the scope of the present invention is not limited to these descriptions and should be broadly interpreted on the basis of the claims. The scope of the present invention also encompasses various modifications and changes based on these descriptions.

The light-emitting devices according to the embodiments of the present disclosure can be used for light sources for backlights of liquid-crystal displays, a variety of lighting apparatuses, large format displays, and various displays for advertisements or destination guides, as well as digital video cameras, image scanners in apparatuses such as facsimile machines, copying machines, and scanners, projectors, and other apparatuses.

The invention claimed is:

1. A light-emitting device comprising:
a light-emitting element;
a wiring board that comprises:
  a substrate, and
  a wiring pattern comprising:
    a plating base layer disposed on the substrate so as to have a gap portion that surrounds a first region in which the light-emitting element is mounted, and
    a plating layer having a groove that surrounds the first region;
a first covering member, at least a portion of which is located in the groove and comprises:
  a reflective material containing layer that contains a first reflective material, and
  a light-transmissive layer formed above the reflective material containing layer; and
a light-transmissive member disposed on the first covering member and the light-emitting element;
wherein the plating layer covers the plating base layer and is located in the gap portion and the groove is above the gap portion.

2. The light-emitting device according to claim 1, comprising:
a package that has a recess defined by an upward-facing surface of the substrate and a lateral surface of a lateral wall that surrounds the bottom surface; and
a second covering member that contains a second reflective material and continuously covers from the lateral surface defining the recess to a portion of an upper surface of the plating layer.

3. The light-emitting device according to claim 2, wherein the package is a ceramic package.

4. The light-emitting device according to claim 1, wherein a width of the gap portion is one time or more and less than twice a thickness of the plating layer.

5. The light-emitting device according to claim 1, wherein a thickness of the plating base layer is 5 μm or more and 20 μm or less.

6. The light-emitting device according to claim 1, wherein the groove is formed directly below a lateral surface of the light-emitting element.

7. An element mounting wiring board comprising:
- a substrate; and
- a wiring pattern comprising:
    - a plating base layer disposed on the substrate so as to have a gap portion that surrounds a first region in which a light-emitting element is mounted, and
    - a plating layer that has a groove surrounding the first region;

wherein the plating layer covers the plating base layer and is located in the gap portion and the groove is above the gap portion.

8. The element mounting wiring board according to claim 7, wherein a width of the gap portion is one time or more and less than twice a thickness of the plating layer.

9. The element mounting wiring board according to claim 7, wherein a thickness of the plating base layer is 5 μm or more and 20 μm or less.

\* \* \* \* \*